US012710695B2

(12) United States Patent
Katsuta et al.

(10) Patent No.: US 12,710,695 B2
(45) Date of Patent: Aug. 18, 2026

(54) FILM FORMATION APPARATUS, FILM FORMATION METHOD, IMPRINTING APPARATUS, PLANARIZATION APPARATUS, AND ARTICLE MANUFACTURING METHOD

(71) Applicant: CANON KABUSHIKI KAISHA, Tokyo (JP)

(72) Inventors: Ken Katsuta, Saitama (JP); Hideki Imamura, Tochigi (JP); Toshiki Ito, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 118 days.

(21) Appl. No.: 18/925,307

(22) Filed: Oct. 24, 2024

(65) Prior Publication Data

US 2025/0138415 A1 May 1, 2025

(30) Foreign Application Priority Data

Oct. 31, 2023 (JP) ................................ 2023-186112

(51) Int. Cl.

*G03F 7/00* (2006.01)
*B29C 41/22* (2006.01)
*B29C 41/36* (2006.01)
*B29C 41/52* (2006.01)

(52) U.S. Cl.

CPC ........... *G03F 7/0002* (2013.01); *B29C 41/22* (2013.01); *B29C 41/36* (2013.01); *B29C 41/52* (2013.01)

(58) Field of Classification Search

CPC ........ B29C 41/22; B29C 41/36; G03F 7/0002
See application file for complete search history.

(56) References Cited

FOREIGN PATENT DOCUMENTS

| | | | |
|---|---|---|---|
| JP | 2022188736 | A | 12/2022 |
| KR | 1020100049005 | A | 5/2010 |
| KR | 1020200038274 | A | 4/2020 |

OTHER PUBLICATIONS

Office Action issued in Korean Appln. No. 10-2024-0150819, mailed on Jun. 16. 2026.

*Primary Examiner* — James Sanders
(74) *Attorney, Agent, or Firm* — ROSSI, KIMMS & McDOWELL LLP

(57) ABSTRACT

A film formation apparatus that can easily control spread of an end of a film to be formed is provided. The film formation apparatus is a film formation apparatus configured to form a film of a curable composition in a space between a substrate and a mold by pressing the mold on the curable composition dispensed onto the substrate. The film formation apparatus includes: a dispenser configured to apply a liquid mixture in which the curable composition and a predetermined solvent are mixed onto the substrate or the top surface of the curable composition; and a controller configured to generate a plurality of sub spaces by dividing the space between the substrate and the mold. The controller performs control such that a first operation of applying the liquid mixture and a second operation of volatilizing the solvent included in the liquid mixture are performed in the order of the first operation and the second operation according to the number of sub spaces.

19 Claims, 6 Drawing Sheets

START
PERFORM DISPENSING DIVIDING STEP
S401
PERFORM DISPENSING STEP
S402
PERFORM VOLATILIZATION STEP
S403
S404
HAS NUMBER OF PERFORMED VOLATILIZATION STEPS REACHED NUMBER OF SUB SPACES?
NO
YES
PERFORM MOLD IMPRESSING STEP
S405
PERFORM CURING STEP
S406
PERFORM RELEASING STEP
S407
END

FILM FORMATION APPARATUS, FILM FORMATION METHOD, IMPRINTING APPARATUS, PLANARIZATION APPARATUS, AND ARTICLE MANUFACTURING METHOD

BACKGROUND

Technical Field

The present disclosure relates to a film formation apparatus, a film formation method, an imprinting apparatus, a planarization apparatus, and an article manufacturing method.

Description of the Related Art

A decrease in size has been required for semiconductor devices, MEMS, and the like, and imprinting technology capable of forming a micro pattern (structure) of several nanometer order on a substrate has attracted attention in addition to the photolithography technology in the related art. The imprint technology is micro-processing technology of supplying (applying) an uncured imprint material to a substrate, bringing a mask (a mold) into contact with the imprint material, and forming a pattern of the imprint material corresponding to a micro-protruding/recessed pattern formed in the mold on the substrate.

In the imprint technology, a photo-curing method is known as a method of curing an imprint material. The photo-curing method is a method of irradiating an imprint material with light to cure the imprint material in a state in which the imprint material supplied to a shot area on a substrate and a mold are brought into contact with each other and forming a pattern of the imprint material as a film on the substrate by detaching the mold from the cured imprint material.

As a method of applying an imprint material onto a substrate, a technique of discretely applying an imprint material as a plurality of droplets onto a substrate using a dispenser is known. This method is a technique of forming a film with high precision by controlling an amount and disposal of droplets on the basis of unevenness information of a substrate and a mold.

In this method, droplets dropped on the substrate come into contact with each other in the course of pressing the mold, and a liquid film of the imprint material is formed. When the droplets come into unintentional contact with each other at the time of formation of the liquid film, air may remain between the mold and the substrate and the droplets be left as bubbles. These bubbles diffuse and disappear in the mold, the substrate, or the imprint material, but since a long time is required according to volumes of the bubbles until the bubbles disappear, this serves as one factor for a decrease in throughput.

Japanese Unexamined Patent Publication No 2022-188736 a technique of rapidly coupling droplets of an imprint material which have been applied onto a substrate. In Japanese Unexamined Patent Publication No. 2022-188736, since a plurality of droplets applied onto the substrate disperse on the substrate before pressing a mold thereon and the droplets are connected to form a film, it is possible to reduce entrainment of bubbles which occurs at the time of pressing the mold. Accordingly, it is possible to shorten a time required for forming a film.

When an imprint material is applied as droplets onto a substrate, an arrangement and an amount of droplets are determined based on the assumption that the droplets spread into an area other than an application target area. It is ideal that the droplets spread to the whole surface of a patterned area provided in the mold to form a liquid film without exceeding the patterned area. When the liquid film spreads over the patterned area, a pattern formed through a previous imprinting operation may be broken or an unnecessary imprint material may be left in an application target area before application of the droplets, which may cause quality failure of the liquid film to be formed. In order not to cause this problem, the disposal and the amount of droplets to be applied onto the substrate are adjusted on the basis of the premise that the droplets spread into an area other than the application target area.

However, in an imprinting process using an imprint material diluted with a solvent, since droplets of the imprint material are rapidly coupled, a time required for spreading of the droplets is short, and a spread distance increases because the amount of applied droplets increases. Accordingly, there is a problem in that it is difficult to control spread of a liquid film end into an area other than an application target area. Particularly, when the thickness of the film to be formed increases, an amount of applied droplets increases, and thus such a tendency becomes stronger.

SUMMARY

A film formation apparatus according to an aspect of the present disclosure is a film formation apparatus that forms a film of a curable composition in a space between a substrate and a mold by pressing the mold on the curable composition dispensed onto the substrate, the film formation apparatus including: a dispenser configured to dispense a liquid mixture in which the curable composition and a predetermined solvent are mixed onto the substrate or the top surface of the curable composition; and a controller configured to generate a plurality of sub spaces by dividing the space between the substrate and the mold, wherein the controller performs control such that a first operation of applying the liquid mixture and a second operation of volatilizing the solvent included in the liquid mixture are performed in the order of the first operation and the second operation according to the number of sub spaces.

Further features of the present disclosure will become apparent from the following description of exemplary embodiments with reference to the attached drawings.

DESCRIPTION OF THE EMBODIMENTS

Figure 1:
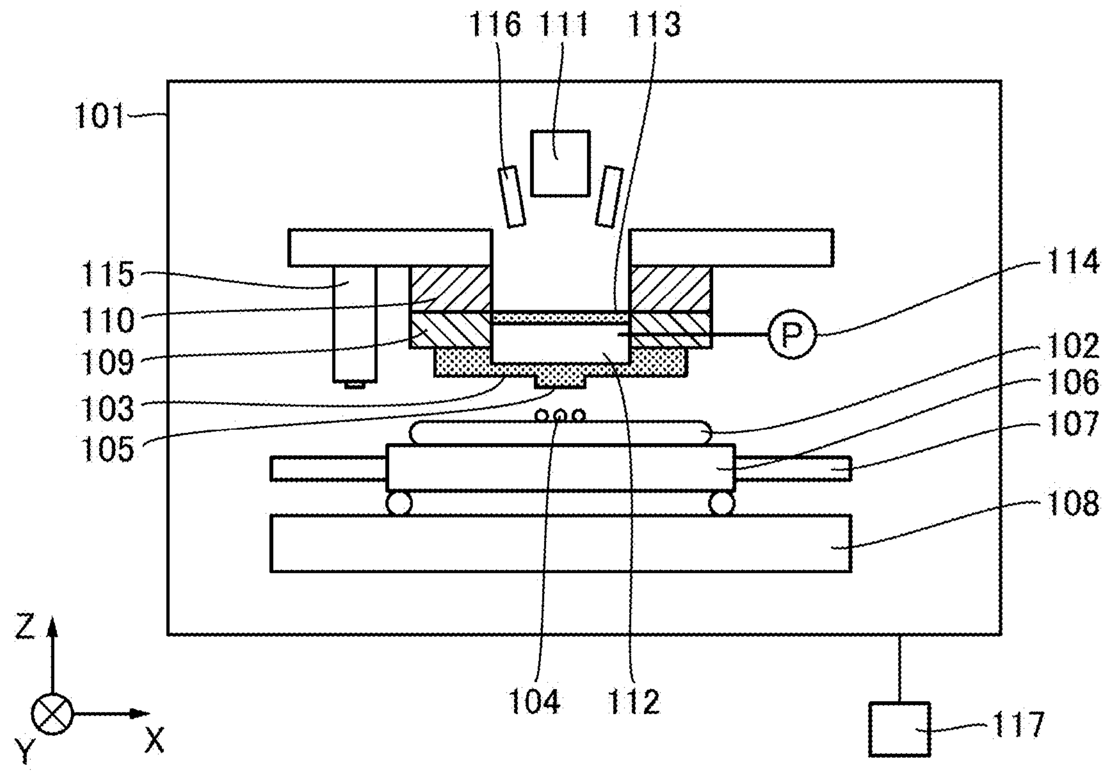
FIG. 1 is a diagram schematically illustrating a film formation apparatus according to a first embodiment.

Hereinafter, embodiments will be described in detail with reference to the accompanying drawings. The following embodiments are not intended to limit the present disclosures described in the appended claims. A plurality of features are described in the embodiments, all of the plurality of features are not essential to the present disclosure, and the plurality of features may be arbitrarily combined. In the drawings, the same or similar elements will be referred to by the same reference signs, and repeated description thereof will be omitted.

First Embodiment

FIG. 1 is a diagram illustrating a configuration of a film formation apparatus 101 according to a first embodiment. The film formation apparatus 101 performs a process of bringing a mold 103 into contact with a plurality of droplets of a curable composition 104 disposed on a substrate 102 and forming a film of the curable composition 104 in a space between the substrate 102 and the mold 103. The film formation apparatus 101 may be configured as, for example, an imprinting apparatus. The film formation apparatus 101 may be configured as a planarization apparatus.

Here, the substrate 102 and the mold 103 can be exchanged with each other, and a film of the curable composition 104 may be formed in a space between the mold 103 and the substrate 102 by bringing the substrate 102 into contact with a plurality of droplets of the curable composition 104 disposed on the mold 103.

In the imprinting apparatus, a pattern of the mold 103 having a pattern is transferred to the curable composition 104 on the substrate 102 using the mold 103. In the imprinting apparatus, the mold 103 including a patterned part (pattern area) 105 in which an uneven pattern is provided is used. In the imprinting apparatus, the curable composition 104 dispensed onto a pattern formation area (an imprint area or a shot area) on the substrate 102 and the patterned part 105 of the mold 103 are bright into contact with (pressed on) each other as an imprinting process. A space between the patterned part and the mold 103 is filled with the curable composition 104, and then the curable composition 104 is cured. Accordingly, the pattern of the patterned part 105 of the mold 103 is transferred to the curable composition 104 on the substrate 102. In the imprinting apparatus, for example, a pattern formed of a cured structure of the curable composition 104 is formed in each of a plurality of pattern formation areas of the substrate 102.

In the planarization apparatus, a film having a flat top surface is formed by bringing the curable composition 104 dispensed onto the substrate 102 into contact with a flat surface of the mold 103 and curing the curable composition 104 using the mold 103 having the flat surface as a flattening process. In the planarization apparatus, when the mold 103 having dimensions (a size) capable of covering the whole area of the substrate 102 is used, a film formed of a cured structure of the curable composition 104 is formed on the whole area of the substrate 102.

A material that is cured by application of curing energy thereto is used as the curable composition. Electromagnetic waves, heat, or the like is used as the curing energy. The electromagnetic waves are, for example, light selected from a wavelength range of 10 nm to 1 mm, and specific examples thereof include infrared light, visible light, and ultraviolet light. In this way, the curable composition is a composition that is cured through irradiation with light or heating. A photo-curable composition that is cured through irradiation with light includes at least a polymerizable compound and a photo-polymerization initiator and may further include a non-polymerizable compound or a solvent according to necessity. The non-polymerizable compound is at least one type selected from a group consisting of a sensitizer, a hydrogen donor, an internally added mold releasing agent, a surfactant, an antioxidant, and polymer components. A viscosity (viscosity at 25° C.) of the curable composition is, for example, equal to or greater than 1 mPa·s and equal to or less than 100 mPa·s.

For example, glass, ceramics, metals, semiconductors, or resins can be used as the material of the substrate. According to necessity, a member formed of a material other than the substrate may be provided on the surface of the substrate. The substrate, for example, includes a silicon wafer, a compound semiconductor wafer, and quartz glass.

In this specification and the accompanying drawings, directions are described in an XYZ coordinate system in which a direction parallel to the surface of the substrate 102 is defined as an XY plane. Directions parallel to an X axis, a Y axis, and a Z axis in the XYZ coordinate system are defined as an X direction, a Y direction, and a Z direction, and rotation around the X axis, rotation around the Y axis, and rotation around the Z axis are defined as θX, θY, and θZ. Control or driving in the X axis, the Y axis, and the Z axis means control or driving in a direction parallel to the X axis, a direction parallel to the Y axis, and a direction parallel to the Z axis. Control or driving in the θX axis, the θY axis, and the θZ axis means control or driving in rotation around an axis parallel to the X axis, rotation around an axis parallel to the Y axis, and rotation around an axis parallel to the Z axis. Positions are information that is identified on the basis of coordinates in the X axis, the Y axis, and the Z axis, and postures are information that is identified by values of the θX axis, the θY axis, and the θZ axis. Alignment means control of a position and/or a posture.

The film formation apparatus 101 according to the first embodiment includes a substrate holder 106, a substrate drive mechanism 107, a support base 108, a mold holder 109, a mold drive mechanism 110, a curing unit 111, a pressure controller 114, a dispenser 115, a measurer 116, and an information processing apparatus (controller) 117.

The substrate holder 106 holds the substrate 102. The substrate drive mechanism 107 moves the substrate 102 by driving the substrate holder 106. That is, the substrate drive mechanism 107 serves as a drive mechanism that enables movement of the substrate 102 held by the substrate holder 106 in the axis directions. The support base 108 supports the substrate drive mechanism 107.

The mold holder 109 holds the mold 103. The mold holder 109 can hold the mold 103 by attracting an outer circumferential area of an irradiation surface of irradiation light in the mold 103 using a vacuum suction force or an electrostatic attraction force. The mold drive mechanism 110 moves the mold 103 by driving the mold holder 109. That is, the mold drive mechanism 110 serves as a drive mechanism that enables movement of the mold 103 held by the mold holder 109 in the axis directions.

Here, the substrate drive mechanism 107 and the mold drive mechanism 110 constitute a relative movement mechanism for moving at least one of the substrate 102 and the mold 103 such that the relative position between the substrate 102 and the mold 103 is adjusted. This adjustment of the relative position between the substrate 102 and the mold 103 using the relative movement mechanism includes driving for bringing the curable composition 104 on the substrate 102 and the mold 103 into contact and driving for releasing the mold 103 from the cured curable composition 104 on the substrate 102. This adjustment of the relative position between the substrate 102 and the mold 103 using the relative movement mechanism includes alignment between the substrate 102 and the mold 103. The substrate drive mechanism 107 is configured to drive the substrate 102 with respect to a plurality of axes (for example, three axes including the X axis, the Y axis, and the θZ axis, preferably, six axes including the X axis, the Y axis, the Z axis, the θX axis, the θY axis, and the θZ axis). The mold drive mechanism 110 is configured to drive the mold 103 with respect to a plurality of axes (for example, three axes including the Z axis, the θX axis, and the θY axis, preferably, six axes including the X axis, the Y axis, the Z axis, the θX axis, the θY axis, and the θZ axis).

The curing unit (irradiation unit) 111 applies, for example, curing energy (for example, ultraviolet light) to the curable composition 104 via the mold 103 to cure the curable composition 104 on the substrate 102. Specifically, the curing unit 111 cures the curable composition 104 filled into a space between the substrate 102 and the mold 103.

A transmission member 113 for forming a pressure control space 112 on a rear side (a side opposite to the surface facing the substrate 102) of the mold 103 is provided in the film formation apparatus 101. The transmission member 113 is formed of a material transmitting curing energy from the curing unit 111 and enables application of curing energy to the curable composition 104 on the substrate 102.

The pressure controller 114 controls deformation of the mold 103 in the Z-axis direction by controlling the pressure in the pressure control space 112. For example, when the pressure controller 114 sets the pressure in the pressure control space 112 to be higher than the atmospheric pressure, the mold 103 is deformed toward the substrate 102.

The dispenser 115 dispenses (supplies or disposes) or distributes the curable composition 104 or a liquid mixture 203 in which the curable composition 104 and a solvent 202 are mixed and which will be described later onto the substrate 102 or the top surface of the curable composition. In the film formation apparatus 101, the curable composition 104 may be dispensed onto the substrate 102 using an apparatus other than the film formation apparatus 101. In this case, the substrate 102 onto which the curable composition 104 has been dispensed may be carried into the film formation apparatus 101 using a carrying mechanism (not illustrated). In this case, the film formation apparatus 101 may not include the dispenser 115. In the present embodiment, the liquid mixture 203 is dispensed, but the curable composition 104 may be dispensed.

The measurer 116 measures misalignment (an alignment error) between the substrate 102 (or the pattern formation area of the substrate 102) and the mold 103 in the film formation apparatus 101.

The information processing apparatus 117 (hereinafter referred to as the controller 117) includes a CPU and a memory, is constituted by at least one general-purpose or dedicated computer, and is connected to the constituents of the film formation apparatus 101 via lines. The controller 117 comprehensively controls operations, adjustments, and the like of the constituents of the film formation apparatus 101 as a whole in accordance with a program stored in the memory. The controller 117 may be unified with (provided in the same casing as) another constituent of the film formation apparatus 101 or be provided separately from (provided in different casings from) another part of the film formation apparatus 101. Alternatively, the controller 117 may be provided at a place different from the film formation apparatus 101 and may be remotely controlled.

The controller 117 may be constituted by a programmable logic device (PLD) such as a field-programmable gate array (FPGA) or an application-specific integrated circuit (ASIC).

FIG. 2 is a diagram illustrating an example of a film forming step using the liquid mixture 203 in which the curable composition 104 and the solvent 202 are mixed in the film formation apparatus 101 according to the first embodiment. In the first embodiment, it is assumed that the film formation apparatus 101 is used as an imprinting apparatus.

A process of forming a film of a curable composition on the substrate 102 using an imprinting apparatus includes a dispensing step, a volatilization step, an impressing step, a curing step, and a releasing step. These steps are also referred to as an imprinting process. When the substrate 102 in which the curable composition 104 has been dispensed onto the substrate 102 by an external apparatus as described above is used, the dispensing step is excluded from the imprinting process.

The coordinate system defined in FIG. 1 is used in FIGS. 2A to 2E. It is assumed that the substrate 102 includes an even surface and a pattern (an uneven pattern) is formed in the rectangular patterned part 105 of the mold 103. FIGS. 2A to 2E are schematic diagrams, and thus an actual shape is simplified for the purpose of easy explanation.

Figure 2A:
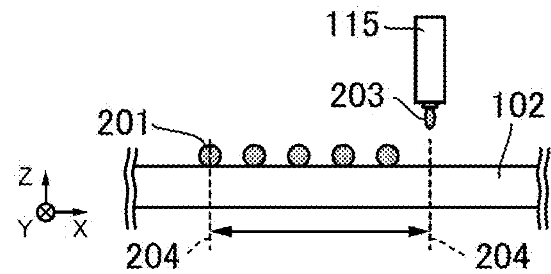
FIGS. 2A to 2E are diagrams schematically illustrating a flow of film forming steps using the film formation apparatus according to the first embodiment.

The dispensing step will be described below with reference to FIG. 2A. FIG. 2A is a diagram illustrating the dispensing step in the film forming process (the imprinting process). Here, the dispensing step is a step of dispensing the curable composition 104 as a plurality of droplets 201 onto the substrate 102 using the dispenser 115.

In the present embodiment, instead of dispensing the curable composition 104 onto the substrate 102 without any change, a liquid mixture 203 in which a solvent 202 is mixed at a predetermined proportion into the curable composition 104 is prepared, and the liquid mixture 203 is supplied to the dispenser 115 and is used. That is, the dispenser 115 dispenses (supplies) the liquid mixture 203 in which the curable composition 104 and the solvent 202 are mixed onto the substrate 102. At this time, the liquid mixture 203 is disposed on the substrate 102 in a state of droplets 201. The liquid mixture 203 is a curable composition which is diluted with the solvent 202. Mixing of the solvent 202 into the curable composition 104 to form the liquid mixture 203 is performed for the purpose of an increase in an arrangement density of the droplets 201 and a decrease in distance between the droplets 201 according to a dilution ratio.

The solvent 202 in the present embodiment includes a solvent of which a boiling point at the normal pressure is equal to or greater than 80° C. and less than 250° C. as a predetermined component. Examples of the component of the solvent 202 include an alcohol-based solvent, a ketone-based solvent, an ether-based solvent, an ester-based solvent, and a nitrogen-containing solvent. Out of these components of the solvent 202, one type can be used alone or two or more types can be combined. The boiling point at the normal pressure of the component of the solvent 202 is set to be equal to or greater than 80° C., preferably equal to or greater than 140° C., and more preferably equal to or greater than 150° C. The boiling point at the normal pressure of the component of the solvent 202 is set to be less than 250° C. and preferably less than 200° C. Accordingly, it is preferable that the boiling point at the normal pressure of the component of the solvent 202 be equal to or greater than 150° C.

and less than 200° C. When the boiling point at the normal pressure of the component of the solvent 202 is less than 80° C., a volatilization speed in a volatilization step which will be described later is too high, and thus there is a likelihood that the component of the solvent 202 will be volatilized before the droplets of the liquid mixture 203 are coupled and the droplets of the liquid mixture 203 will not be coupled to each other. When the boiling point at the normal pressure of the component of the solvent 202 is equal to or greater than 250° C., volatilization of the component of the solvent 202 may not be sufficient in the volatilization step which will be described later, and thus there is a likelihood that the component of the solvent 202 will remain in the cured structure of the curable composition 104.

Examples of the alcohol-based solvent include monoalcohol-based solvents such as methanol, ethanol, n-propanol, iso-propanol, n-butanol, iso-butanol, sec-butanol, tert-butanol, n-pentanol, iso-pentanol, 2-methyl butanol, sec-pentanol, tert-pentanol, 3-methoxy butanol, n-hexanol, 2-methyl pentanol, sec-hexanol, 2-ethyl butanol, sec-heptanol, 3-heptanol, n-octanol, 2-ethyl hexanol, sec-octanol, n-nonyl alcohol, 2,6-dimethyl heptanol, 4,n-decanol, sec-undecyl alcohol, trimethylnonyl alcohol, sec-tetradecyl alcohol, sec-heptadecyl alcohol, phenol, cyclohexanol, methyl cyclohexanol, 3,3,5-trimethyl cyclohexanol, benzyl alcohol, phenylmethyl carbinol, diacetone alcohol, and cresol and polyalcohol-based solvents such as ethylene glycol, 1,2-propylene glycol, 1,3-butylene glycol, 2,4-heptanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerine.

Examples of the ketone-based solvent include acetone, methylethyl ketone, methyl-n-propyl ketone, methyl-n-butyl ketone, diethyl ketone, methyl-iso-butyl ketone, methyl-n-pentyl ketone, ethyl-n-butyl ketone, methyl-n-hexyl ketone, di-iso-butyl ketone, trimethyl nonanone, cyclohexanone, methyl cyclohexanone, 2,4-pentanedione, acetonylacetone, diacetone alcohol, acetophenone, and fenchone.

Examples of the ether-based solvent include ethyl ether, iso-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, 2-methoxy ethanol, 2-ethoxy ethanol, ethylene glycol diethyl ether, 2-n-butoxy ethanol, 2-n-hexoxy ethanol, 2-phenoxy ethanol, 2-(2-ethyl butoxy) ethanol, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, 1-n-butoxy 2-propanol, 1-phenoxy-2-propanol, propylene glycol monomethyl ether, propylene glycol monoethyl ether, propylene glycol monopropyl ether, dipropylene glycol monomethyl ether, dipropylene glycol monoethyl ether, dipropylene glycol monopropyl ether, tripropylene glycol monomethyl ether, tetrahydrofuran, and 2-methyl tetrahydrofuran.

Examples of the ester-based solvent include diethyl carbonate, methyl acetate, ethyl acetate, amyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Examples of the nitrogen-containing solvent include N-methyl formamide, N,N-dimethyl formamide, N,N-diethyl formamide, acetoamide, N-methyl acetoamide, N,N-dimethyl acetoamide, N-methyl propionamide, and N-methyl pyrrolidone.

Out of the aforementioned solvents, the ether-based solvents and the ester-based solvents can be preferably used. In view of excellent film formation characteristics, the ether-based solvents and the ester-based solvents having a glycol structure can be more preferably used.

More preferable examples include propylene glycol monomethyl ether, propylene glycol monoethyl ether, propylene glycol monopropyl ether, propylene glycol monomethyl ether acetate, propylene glycol monoethyl ether acetate, and propylene glycol monopropyl ether acetate.

Still more preferable examples include propylene glycol monomethyl ether acetate and ethyl isocyanurate di(meth) acrylate.

In the present embodiment, a preferable solvent includes at least one of a ester structure, a ketone structure, a hydroxyl group, and an ether structure. Specifically, such a solvent is one selected from propylene glycol monomethyl ether acetate (with a boil point of 146° C.), a propylene glycol monomethyl ether, cyclohexanone, 2-heptanone, γ-butyrolactone, and ethyl lactate or a solvent in which they are mixed.

In the present embodiment, a polymerizable compound with a boiling point of equal to or greater than 80° C. and less than 250° C. at the normal pressure may be used as a component of the solvent 202. Examples of the polymerizable compound with a boiling point of equal to or greater than 80° C. and less than 250° C. at the normal pressure include cyclohexyl acrylate (198° C.), benzyl acrylate (229° C.), isobornyl acrylate (245° C.), tetrahydrofurfuryl acrylate (202° C.), trimethyl cyclohexyl acrylate (232° C.), isooctyl acrylate (217° C.), n-octyl acrylate (228° C.), ethoxyethoxy ethyl acrylate (with a boiling point of 230° C.), divinyl benzene (193° C.), 1,3-diisopropenyl benzene (218° C.), styrene (145° C.), and α-methyl styrene (165° C.).

In the present embodiment, when the whole volume of the liquid mixture 203 is defined as 100 vol %, the content of the solvent 202 is set to be equal to or greater than 70 vol % and equal to or less than 95 vol %. Preferably, the content of the solvent 202 is set to be equal to or greater than 70 vol % and equal to or less than 85 vol %. More preferably, the content of the solvent 202 is set to be equal to or greater than 70 vol % and equal to or less than 80 vol %. When the content of the solvent 202 is less than 70 vol %, a thin film cannot be obtained after the solvent 202 has been volatilized under the conditions in which a substantially continuous liquid film is acquired. When the content of the solvent 202 is greater than 95 vol %, a thick film cannot be obtained after the solvent 202 has been volatilized even if droplets are most densely dropped using an ink jet method or the like.

Here, when the liquid mixture 203 is disposed as droplets 201 on the substrate 102 (applied as droplets onto the substrate 102) by the dispenser 115, the liquid mixture 203 spreads in a concentric shape centered on the disposal position. Since the liquid mixture 203 has a higher arrangement density of the droplets 201 and a smaller distance between the droplets 201 than those in a case in which the curable composition 104 is used alone, the droplets can be easily coupled to other droplets 201, and a liquid film is formed before the impressing step.

When the curable composition 104 not including the solvent 202 is used, the droplets 201 are crushed in the impressing step which will be described later, and the droplets 201 are coupled to each other to form a film. Accordingly, bubbles are left between the substrate 102 and the mold 103 (the patterned part 105 of the mold 103) at the time of formation of a liquid film, and thus a bubble defect is likely to occur. However, with the liquid mixture 203 in the present embodiment, since a liquid film is formed at least before the impressing step, remaining of bubbles are less likely to occur between the substrate 102 and the mold 103. Accordingly, it is possible to curb occurrence of a bubble defect.

Regarding the droplets 201 of the liquid mixture 203, a total of three parameters including an amount of one droplet and a coordinate in the X direction and a coordinate in the Y direction of the dispensing position on the substrate 102 are stored in a droplet list in the form of a file in a storage medium such as a memory. The information on the plurality of droplets 201 is changed mainly according to with what thickness a liquid film is to be formed between the substrate 102 and the mold 103. That is, the controller 117 can determine the number of droplets 201 to be dispensed, the coordinate in the X direction and the coordinate in the Y direction of each droplet, and an amount of dispensing on the basis of information indicating with what thickness a liquid film is formed between the substrate 102 and the mold 103 and can prepare a droplet list. Here, since the solvent 202 is volatilized in the volatilization step which will be described later, it is preferable that the thickness of the final film be calculated on the basis of an amount of the curable composition 104.

Regarding the amount of droplets, the controller 117 refers to the droplet list and controls the dispenser 115 on the basis of the referred-to droplet list. A droplet 201 dispensed onto an outermost circumference of the dispensing range forms an end of the liquid film. This dispensing position of the droplet 201 is set as an outermost circumferential dispensing positon 204. Information of the outermost circumferential dispensing positon 204 can be acquired from the coordinate in the X direction and the coordinate in the Y direction of the center of the droplet 201 dispensed onto the outermost circumference with reference to the droplet list. Since the droplets 201 are dispensed onto the substrate 102 and then spread, the droplets spread from the outermost circumferential dispensing position 204. Here, this spread range will be omitted to simplify the phenomenon in the following description of the present embodiment.

The dispenser 115 is driven in various manners, and the dispenser 115 in the present embodiment uses an electrically driven piezoelectric actuator. The electrically driven dispenser can easily control the amount of the droplets 201 which are dispensed by controlling a voltage value applied to the piezoelectric actuator. The position at which a droplet 201 is dispensed, that is, the dispensing position of the droplet 201, is controlled by changing a relative position between the substrate 102 and the dispenser 115. In the present embodiment, a method of changing the relative position by causing the substrate drive mechanism 107 in which the substrate 102 is installed to move in the X direction and the Y direction is employed. Accordingly, the controller 117 controls the dispensing position by controlling the substrate drive mechanism 107.

Figure 2B:
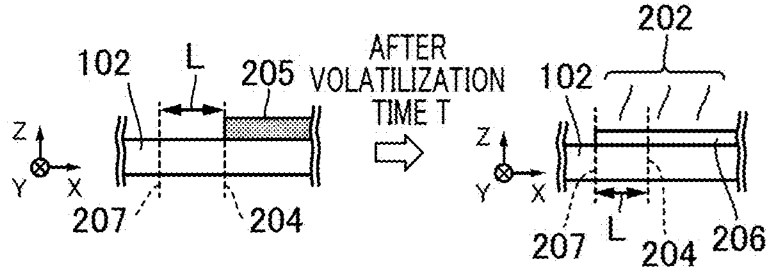

The volatilization step which is a step performed after the dispensing step will be described below with reference to FIG. 2B. FIG. 2B is a diagram illustrating an example of the volatilization step of the film forming process (the imprinting process). The volatilization step is a step of volatilizing the solvent 202 included in the liquid mixture 203 dispensed onto the substrate 102. The droplets 201 are coupled to each other in between the dispensing step and the volatilization step to form the liquid mixture film 205 of the liquid mixture 203. In the dispensing step, the solvent 202 is volatilized from the liquid mixture film 205 to form a curable composition liquid film 206 of only the curable composition 104. Volatilization of the solvent 202 is completed before the impressing step which will be described later is started. That is, a state of the curable composition liquid film 206 of only the curable composition 104 is maintained in the impressing step.

When the time until volatilization of the solvent 202 included in the liquid mixture 203 is completed is defined as a volatilization time T, a method of waiting for natural spread of the solvent in the air, that is, a method of waiting for a predetermined time, is used as a method of shortening the volatilization time T. In the waiting time in this method, it is possible to achieve an increase in efficiency of the whole film forming process by performing other steps in parallel or in cooperation or the like.

Since volatilization of the solvent 202 can be promoted by circulating gas in a space above the liquid mixture film 205 to forcibly form a convection environment, it is possible to decrease the volatilization time T. For example, a method of forcibly forming a convection current of gas above the substrate 102 or a method of activating the substrate drive mechanism 107 can be used. For example, a method of promoting volatilization of the solvent 202 by heating the liquid mixture film 205 can also be used. In this case, the film formation apparatus 101 further includes a heating unit constituted by a heater or the like and applies heat to the liquid mixture film 205 using the heating unit.

As described hitherto, in order to control behavior of the curable composition liquid film 206, it is preferable to decrease the volatilization time T as short as possible.

A position at which an end of the curable composition liquid film 206 arrives finally in the volatilization step is defined as a target position 207 by a coordinate in the X direction and a coordinate in the Y direction. Here, the target position 207 is set not to exceed the outer circumference of the patterned part 105 with which the curable composition liquid film 206 comes into contact in the impressing step. In the impressing step which is performed after the volatilization step, the mold 103 is brought into contact with the curable composition liquid film 206 and a force is applied to the curable composition liquid film 206. This is because, when the target position is not set to be inside of the outer circumference of the patterned part 105, the curable composition liquid film 206 may exceed the outer circumference of the patterned part 105. This value, that is, the target position 207, is determined before the imprinting process with reference to results of experiment, simulation, or the like.

A method of determining the outermost circumferential dispensing position 204 will be described below. The liquid mixture film 205 spreads on the substrate 102 until volatilization of the solvent 202 included therein is completed. This amount of spread differs according to a surface state of the substrate 102, a mixing proportion of the solvent 202, a thickness (a dimension in the Z direction) of the liquid mixture film 205, or the volatilization time T. Accordingly, this amount of spread is calculated in advance by experiment, simulation, or the like. When the amount of spread is known, the outermost circumferential dispensing position 204 is provided at a position which is inward by the amount of spread in a droplet dispensing range from the target position 207.

A distance from the outermost circumferential dispensing position 204 to the target position 207 is defined as a liquid film control distance L. For the purpose of easy understanding, an end of the curable composition liquid film 206 illustrated in FIG. 2B is aligned with the outermost circumferential dispensing position 204. As described above, the end is actually located on the target position 207 side due to an influence of the spread of the droplets 201 and is simplified in FIGS. 2A to 2E.

Behavior of the end of the curable composition liquid film 206 in the impressing step and behavior of the end of the liquid mixture film 205 in the volatilization time T are determined with reference to results of experiment and simulation as described above. These results can be stored as a result list in the storage medium such as a memory before the imprinting process, and a structure for referring to the information can be provided according to necessity.

Figure 2C:
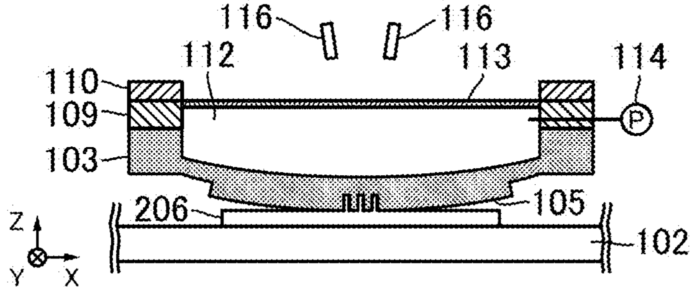

The impressing step which is performed after the volatilization step will be described below with reference to FIG. 2C. FIG. 2C is a diagram illustrating an example of the impressing step in the film forming process (the imprinting process). The impressing step is a step of pressing the mold 103 on the curable composition liquid film 206 spread on the substrate 102 and filling a space between the substrate 102 and the mold 103 with the curable composition liquid film 206. Accordingly, the pattern provided in the patterned part 105 is filled with the curable composition liquid film 206, and the final shape of the curable composition liquid film 206 is formed. Regarding the thickness (the dimension in the Z direction) of the curable composition liquid film 206, the total volume of the curable composition 104 out of the total volume of the liquid mixture 203 is calculated using the droplet list. Then, the thickness is calculated by subtracting the volume filled in the patterned part 105 from the calculated total volume and dividing the result value by the area (the dimensions in the X direction and the Y direction) of the patterned part 105.

In the impressing step, the position of the mold 103 relative to the substrate 102 is adjusted. In the present embodiment, the mold drive mechanism 110 determines the position in the Z direction of the mold 103 relative to the substrate 102. At the time of impressing, the mold 103 is brought into contact with the curable composition liquid film 206 from the center of the patterned part 105. Accordingly, it is possible to decrease bubbles received by the curable composition liquid film 206. Accordingly, the central part of the mold 103 is bent in a convex shape by increasing the pressure in the pressure control space 112 using the pressure controller 114.

When the central part of the mold 103 is bent in a convex shape using the pressure controller 114, the position in the Z direction of the mold 103 needs to be set to a distance at which the curable composition liquid film 206 spread on the substrate 102 is not brought into contact with the patterned part 105 bent in a convex shape. Then, the substrate drive mechanism 107 moves to determine the positions in the X direction and the Y direction of the substrate 102 relative to the mold 103. At this time, the substrate 102 and the mold 103 are aligned by measuring alignment marks provided in the substrate 102 and the mold 103 using the measuring unit 116.

After alignment has been completed, the mold 103 bent in a convex shape is made to be closer to the substrate 102 using the mold drive mechanism 110 and is pressed while gradually coming into contact with the curable composition liquid film 206 on the substrate 102. At this time, a force generated in the mold drive mechanism 110 is referred to as a pressing force and is controlled by the controller 117. When the mold 103 is pressed, the pressure controller 114 also controls the pressure in the pressure control space 112. In the control at this time, the convex shape of the mold 103 is alleviated, and the pressure is controlled such that parallelism of the curable composition liquid film 206 can be maintained, that is, such that the mold 103 is returned to a shape before the pressure is applied thereto, when the filling is completed. In the impressing step, the curable composition liquid film 206 with a uniform thickness is formed in this way.

Figure 2D:
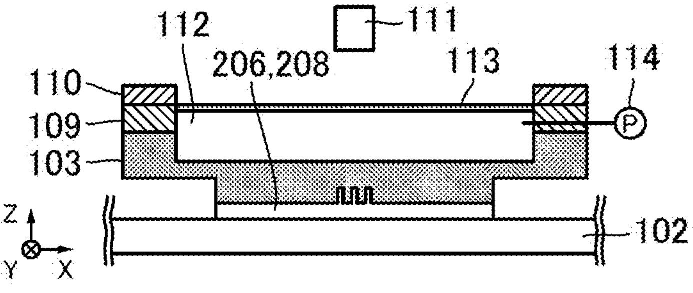

The curing step which is a step performed after the impressing step will be described below with reference to FIG. 2D. FIG. 2D is a diagram illustrating an example of the curing step in the film forming process (the imprinting process). The curing step is a step of curing the curable composition liquid film 206 formed in the impressing step. Since a material which is cured by light is used as the curable composition 104 according to the present embodiment as described above, the curable composition 104 is cured by irradiating the curable composition liquid film 206 with light such as ultraviolet light. Accordingly, a formation film 208 can be formed. In the present embodiment, curing energy emitted from the curing unit 111 is light, and the curable composition liquid film 206 is cured by irradiating the curable composition 104 with the light emitted from the curing unit 111 via the transmission member 113 and the mold 103. Here, since the curable composition liquid film 206 causes curing contraction at the time of curing, the formation film 208 is smaller than the curable composition liquid film 206. A contraction rate differs depending on the curable composition 104 which is used.

Figure 2E:
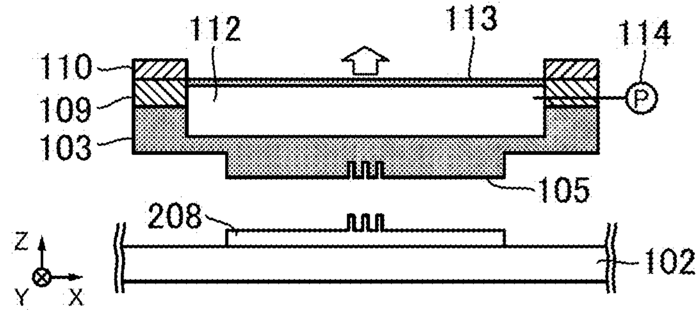

The releasing step which is a step performed after the curing step will be described below with reference to FIG. 2E. FIG. 2E is a diagram illustrating an example of the releasing step in the film forming process (the imprinting process). The releasing step is a step of removing (detaching) the curable composition liquid film 206 from the mold 103. In the releasing step, the mold drive mechanism 110 drives the mold 103 in a direction in which the mold 103 is separated from the substrate 102 (the +z direction). At this time, a force generated in the mold drive mechanism 110 is referred to as a releasing force, and the releasing force is controlled by the controller 117.

The aforementioned steps constitute a film forming process using the liquid mixture 203 in which the solvent 202 and the curable composition 104 are mixed, and the formation film 208 in which occurrence of a bubble defect is curbed can be generated by performing this series of steps for each pattern formation area.

Here, in the film forming process (the imprinting process) of forming the formation film 208, when it is intended to increase the thickness (the dimension in the Z direction) of the formation film 208, an amount of the liquid mixture 203 which is dispensed in the dispensing step is increased. Accordingly, since the thickness (the dimension in the Z direction) of the liquid mixture film 205 is increased, the volatilization time T and the liquid film control distance L are increased. As a result, an error for spread of the liquid mixture film 205 may be increased, and it may be difficult to control spread of the liquid film end.

Therefore, in the film forming process using the film formation apparatus 101 according to the present embodiment, the dispensing step is divided. At the time of division of the dispensing step, the controller 117 controls an operation (a first operation) of dispensing (supplying) the liquid mixture 203 and an operation (a second operation) of volatilizing the solvent 202 included in the liquid mixture 203 in the film formation apparatus 101. Specifically, the volatilization step is performed every divided dispensing step. For example, when the dispensing step is divided into two steps, the volatilization step is performed after the first dispensing step has been performed, and then the second dispensing step and the volatilization step are performed in the same way as in the first time. When the dispensing step is divided into two or more steps, the divided dispensing step and the volatilization step are repeatedly performed by the division number. The same number of volatilization steps as the number of divided dispensing steps is performed. That is, the controller 117 controls the film formation apparatus 101 such that the first operation and the second operation are repeatedly performed in the order of the first operation and the second operation according to the number of sub spaces (according to the number of sub spaces).

Accordingly, it is possible to decrease the thickness (the dimension in the Z direction) of the liquid mixture film 205 which is formed at one time. As a result, since the volatilization time T and the liquid film control distance L are decreased, it is possible to easily decrease an error for spread of the liquid mixture film 205 and to control spread of the liquid film end.

FIGS. 3A to 3E are diagrams illustrating an example of steps of forming the formation film 208 using an imprinting apparatus when the dispensing step is divided. In FIGS. 3A to 3E, it is assumed that the dispensing step is divided into two steps including a first dispensing step and a second dispensing step similarly to the dispensing step of the film forming method described above with reference to FIGS. 2A to 2E. That is, it is assumed that the first operation is performed two times. It is also assumed that two steps including a first volatilization step and a second volatilization step are performed as the volatilization step similarly to the number of dispensing steps. That is, it is assumed that the second operation is also performed two times. Description of the processes in the same steps as the steps illustrated in FIGS. 2A to 2E will be partially omitted for the purpose of simplification.

When the number of divided dispensing steps is increased, it is possible to more easily control an end in the film thickness. On the other hand, when the number of divided dispensing steps is increased, a time is required until the impressing step is started according to the number of divided dispensing steps, and the throughput of the film formation apparatus 101 is decreased. Accordingly, the number of divided dispensing steps needs to be determined in consideration of the throughput of the film formation apparatus 101. In the present embodiment, it is assumed that the dispensing step is divided into two steps (the first dispensing step and the second dispensing step) in consideration of the throughput.

Since division of the dispensing step into two steps is the simplest, it is possible to easily control the constituents in the steps. Since the end in the film thickness can be more easily controlled by increasing the number of divided dispensing steps as described above, for example, the dispensing step may be divided into three steps or four steps. In this case, the volatilization steps corresponding to the number of performed dispensing steps are performed after the dispensing steps have been completed. In this way, the number of divided dispensing steps is not limited to two and can be set arbitrarily.

Similarly, when the film formation apparatus 101 is an imprinting apparatus, it is assumed that the substrate 102 includes an even plane and an uneven pattern of a rectangular patterned part 105 is formed in the mold 103 as described above.

Figure 3A:
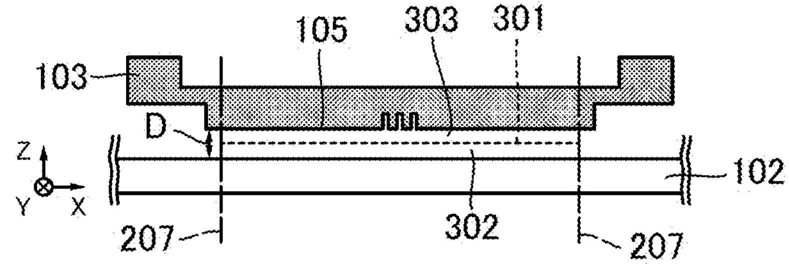
FIGS. 3A to 3E are diagrams schematically illustrating dispensing steps and volatilization steps in a film forming step into which a dispensing step is divided according to the first embodiment.

FIG. 3A is a diagram illustrating an example in which the dispensing step is divided according to the first embodiment. The formation film 208 which is formed using the film formation apparatus 101 does not contract before the curing step. Accordingly, a required amount of the curable composition 104 needs to be determined on the basis of the curable composition liquid film 206 with a larger amount than the formation film 208 in consideration of curing contraction. As a result, the amount of the curable composition 104 is required enough to fill a space by which the substrate 102 and the patterned part 105 are separated by the required thickness (the dimension in the Z direction) of the curable composition liquid film 206 and which is surrounded by the target position 207. The thickness (the dimension in the Z direction) of the curable composition liquid film 206 is defined as a target film thickness D.

In the division method of dividing a space (area) between the substrate 102 and the mold 103 in the Z direction, a space division plane 301 parallel to the X direction and the Y direction is used to divide the space. Out of the divided spaces, a space in which a part of the curable composition liquid film 206 is formed by firstly performing the dispensing step (the first dispensing step) is defined as a first sub space (a first sub area) 302. A space in which a part of the curable composition liquid film 206 is formed by performing the dispensing step (the second dispensing step) after the first sub space 302 is defined as a second sub space (a second sub area) 303. In this way, in the present embodiment, a plurality of sub spaces (divided space) are generated by dividing the space (area) between the substrate 102 and the mold 103.

The process of generating a plurality of sub spaces (sub areas) by dividing the space (in the Z direction) between the substrate 102 and the mold 103 is performed by the controller 117. When the space (in the Z direction) between the substrate 102 and the mold 103 is divided, the controller 117 generates a plurality of sub spaces by dividing the space with a plane parallel to opposing surfaces of the substrate 102 and the mold 103.

The dividing plane has the same meaning as a plane for dividing the target film thickness D. It is preferable that intervals of the target film thickness D divided by the controller 117 be equal (a thickness of half the target film thickness D in this example). Accordingly, for example, when the target film thickness D is divided into three parts, the target film thickness D is equally divided in a thickness of ⅓ the target film thickness D. In this way, the plurality of sub spaces generated by the controller 117 are spaces obtained by equally dividing the distance between the substrate 102 and the mold 103 according to the number of sub spaces. Accordingly, since the thicknesses (dimensions in the Z direction) of the first sub space 302 and the second sub space 303 are equal, it is possible to reduce unevenness in spread of the end of the liquid mixture film 205. Since the maximum value of the thickness of each sub space is the smallest, it is possible to easily control spread of the liquid mixture film 205.

Subsequently, a required amount of curable composition 104 is supplied to the first sub space 302. The amount of applied liquid mixture 203 is determined on the basis of a mixing proportion of the solvent 202 of the liquid mixture 203. When the amount of liquid mixture 203 is determined, an arrangement and an amount of the liquid mixture 203 applied to the substrate 102 are determined, and thus it is possible to prepare a droplet list. Then, in the same way, it is possible to prepare a droplet list for the second sub space 303.

Since the substrate 102 is flat and the space division plane 301 is also flat, the shape of the first sub space 302 is a rectangular parallelepiped. Accordingly, the droplet list can be prepared to fill the rectangular parallelepiped space. On the other hand, for the second sub space 303, since a pattern is provided in the patterned part 105, an increased amount of the liquid mixture 203 needs to be added to the droplet list for the first sub space 302 in consideration of the amount of the curable composition 104 corresponding to the volume of the pattern shape. That is, for a sub space closest to the mold 103 out of the plurality of sub spaces, the controller 117 adjusts a dispensing position and an amount of the liquid mixture 203 on the basis of the pattern provided in the patterned part 105 of the mold 103, and the droplet list is prepared on the basis of the adjustment result.

For example, when unevenness is included in the substrate 102, an increased amount of the liquid mixture 203 needs to be added to the droplet list for the first sub space 302 in consideration of the required amount of the curable composition 104 in consideration of the shape of the unevenness. That is, for a sub space closest to the substrate 102 out of the plurality of sub spaces, the controller 117 adjusts the dispensing position and an amount of the liquid mixture 203 on the basis of the pattern (the shape of unevenness) of the substrate 102, and the droplet list is prepared on the basis of the adjustment result.

In the present embodiment, when sub spaces are generated, the droplet list for the sub space adjacent to the substrate 102 is prepared in consideration of the shape of unevenness of the substrate 102. The droplet list for the sub space adjacent to the patterned part 105 (the mold 103) is prepared in consideration of the shape of unevenness of the pattern. That is, the controller 117 adjusts the dispensing position and the amount of the liquid mixture 203 which is dispensed onto the substrate 102 or the top surface of the curable composition according to the position of the corresponding sub space and prepares a droplet list based on the adjustment result.

For example, it is assumed that the space between the substrate 102 and the mold 103 is divided into three parts. In this case, since two surfaces in the Z direction of a sub space located in the middle are adjacent to the space division planes 301 which are flat surfaces, a droplet list can be prepared by the controller 117 using information of only the sub space.

The droplet lists corresponding to the first sub space 302 and the second sub space 303 are stored (retained) in a storage medium (a storage unit) such as a memory by the controller 117. Then, the controller 117 can control the operation of the dispenser 115 in the first dispensing step and the second dispensing step by reading the droplet lists prepared in advance according to the positions of the sub spaces from the storage medium.

It is preferable that the same liquid mixture 203 be dispensed in a plurality of dispensing steps. That is, it is preferable that the same component of the curable composition 104 and the same component of the solvent 202 in the liquid mixture 203 dispensed in the dispensing steps be dispensed for the sub spaces generated by the controller 117.

When another liquid different from the liquid mixture 203 in addition to the liquid mixture 203 is dispensed, it is necessary to prepare the dispensers 115 corresponding to the number of liquids to be dispensed. When the dispensers 115 corresponding to the number of liquids to be dispensed are prepared, it causes an increase in size of the film formation apparatus 101 and complication in control of the plurality of dispensers 115. For example, when the liquid mixture in which the mixing proportion of the solvent 202 in the liquid mixture 203 has changed is dispensed, a plurality of dispensers 115 are required for the aforementioned reasons. Similarly, an increase in size of the film formation apparatus 101 and complication of control of the plurality of dispensers 115 are caused. Accordingly, it is preferable that the same mixing ratio of the curable composition 104 and the solvent 202 in the liquid mixture 203 which is dispensed in the dispensing steps be used for the sub spaces generated by the controller 117.

The curable composition 104 and the solvent 202 may be separately contained in tanks of the dispenser 115, and the liquid mixture 203 in which both are mixed during operation may be dispensed onto the substrate 102. However, in this case, it is difficult to stabilize the quality of the liquid mixture 203 and control of the dispenser 115 is complicated. In this way, other liquids may be prepared, and a liquid mixture in which the curable composition 104 and the solvent 202 are mixed may be dispensed during operation. That is, the film formation apparatus 101 having the aforementioned configuration may be provided in some applications. The aforementioned step of dividing a space, that is, the step of generating sub spaces, is defined as a dispensing dividing step.

Figure 3B:
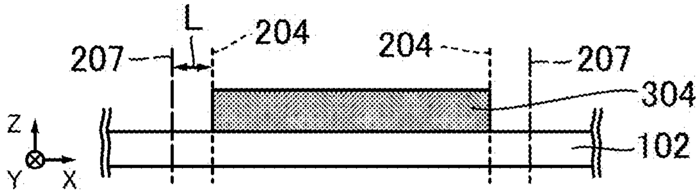

FIG. 3B illustrates a first liquid mixture film 304 formed on the substrate 102 just after the first dispensing step has been completed. That is, the first liquid mixture film 304 which is formed by coupling droplets 201 of the liquid mixture 203 dispensed (disposed) onto the substrate 102 through the first-time first operation to each other is illustrated. For the purpose of easy understanding, an end of the first liquid mixture film 304 illustrated in FIG. 3B is aligned with the outermost circumferential dispensing position 204. In real, since the liquid mixture 203 spreads, an end of the first liquid mixture film 304 is present on the target position 207 side and is simplified for the purpose of easy explanation.

In the first dispensing step, an amount of the liquid mixture 203 is half the amount in a case in which the liquid mixture 203 is dispensed through one dispensing step. Accordingly, the liquid film control distance L is smaller than that in a case in which the liquid mixture 203 is dispensed through one first operation (the distance is shortened). The volatilization time T is shorter than that in the case in which the liquid mixture is dispensed through one first operation (the volatilization time is shortened).

Figure 3C:
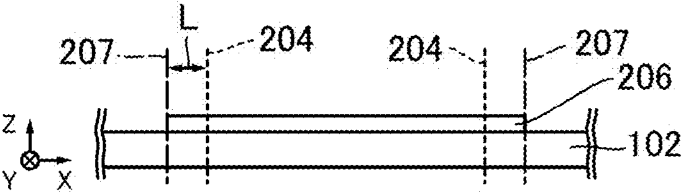

FIG. 3C illustrates a curable composition liquid film 206 in which the solvent 202 is volatilized from the first liquid mixture film 304 formed on the substrate 102 just after the first volatilization step has been completed. That is, a curable composition liquid film 206 in which the solvent 202 has been volatilized from the first liquid mixture film 304 formed of the liquid mixture 203 dispensed onto the substrate 102 through the first-time second operation is illustrated. The curable composition liquid film 206 in FIG. 3C is formed in a thickness which is half the thickness (the dimension in the Z direction) of the curable composition liquid film 206 to be formed on the substrate 102 before the impressing step. The first volatilization step is completed before the second dispensing step is started. That is, the second dispensing step is performed after the curable composition liquid film 206 in which the solvent 202 has been volatilized from the first liquid mixture film 304 has been formed on the substrate 102.

In the curable composition 104, spread of the curable composition liquid film 206 almost stops after the solvent 202 has been volatilized. Even when the curable composition liquid film 206 spreads minutely, the position of the target position 207 can be set on the basis of the time required until the curing step, and thus an influence thereof is small.

Figure 3D:
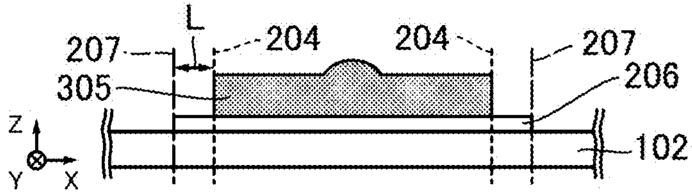

FIG. 3D is a diagram illustrating a second liquid mixture film 305 which is formed on the top surface of the curable composition liquid film 206 just after the second dispensing step has been completed. That is, the second liquid mixture film 305 which is formed by dispensing the liquid mixture 203 on the top surface of the curable composition liquid film 206 formed on the substrate 102 through the first-time second operation through the second-time first operation and coupling the droplets 201 of the liquid mixture 203 to each other is illustrated. In this way, when the first operation is performed after the second operation, the controller 117 dispenses the liquid mixture 203 on the curable composition (the curable composition liquid film) in which the solvent 202 has been volatilized from the liquid mixture (the mixed liquid film). For the purpose of easy understanding, an end of the second liquid mixture film 305 illustrated in FIG. 3D is aligned with the outermost circumferential dispensing position 204. Accordingly, the end is located on the target position 207 side due to an influence of spread of the droplets 201, but is simplified for the purpose of easy explanation.

In the second dispensing step, similarly to the first dispensing step, an amount of the liquid mixture 203 is half the amount in the case in which the liquid mixture 203 is dispensed through one dispensing step. Accordingly, similarly to the first dispensing step, the thickness (the dimension in the Z direction) of the curable composition liquid film 206 is half the thickness in the case in which the liquid mixture 203 is dispensed through one first operation. As a result, the liquid film control distance L is shorter than that in the case in which the liquid mixture is dispensed through one first operation (the distance is shortened). The volatilization time T is shorter than that in the case in which the liquid mixture is dispensed through one first operation (the volatilization time is shortened).

In FIG. 3D, the liquid mixture 203 which is added in consideration of the volume of the pattern of the patterned part 105 of the mold 103 is emphasized, but the added amount is much smaller than the volume of the second sub space 303 and thus an influence of an increase in the amount of the second liquid mixture film 305 is small.

Figure 3E:
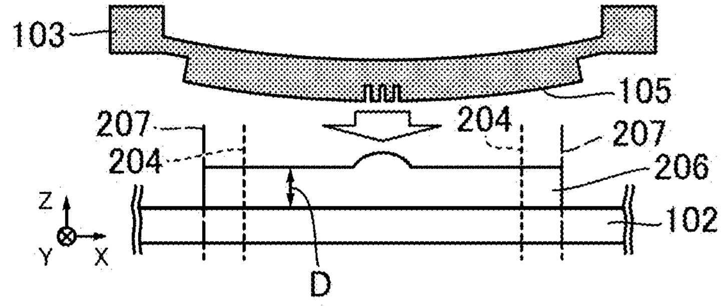

FIG. 3E is a diagram illustrating the curable composition liquid film 206 which is formed on the top surface of the substrate 102 just after the second volatilization step has been completed. That is, the curable composition liquid film 206 in which the solvent 202 has been volatilized from the second liquid mixture film 305 formed through the second-time second operation is illustrated. The second liquid mixture film 305 subjected to the second volatilization step is unified with the underlying curable composition liquid film 206 to form the curable composition liquid film 206 with a thickness of the target film thickness D. In this way, by dividing the dispensing step and performing the volatilization steps corresponding to the number of divided dispensing steps, it is possible to easily control the end of the curable composition liquid film 206 to the target position 207.

In the liquid mixture 203 which is added to the second liquid mixture film 305 to cope with unevenness of the patterned part 105 of the mold 103, since the volatilization time T is short, the liquid mixture 203 does not flow and is likely to stay at the target position. Accordingly, it is possible to transfer the pattern of the patterned part 105 of the mold 103 with higher precision.

In this way, when the dispensing step is divided into two steps, the dispensing step is performed in the order of a first dispensing step, the first volatilization step, the second dispensing step, and the second volatilization step. After formation of the curable composition liquid film 206 corresponding to the target film thickness D has been completed (after the volatilization step has been completed), the impressing step is performed.

Figure 4:
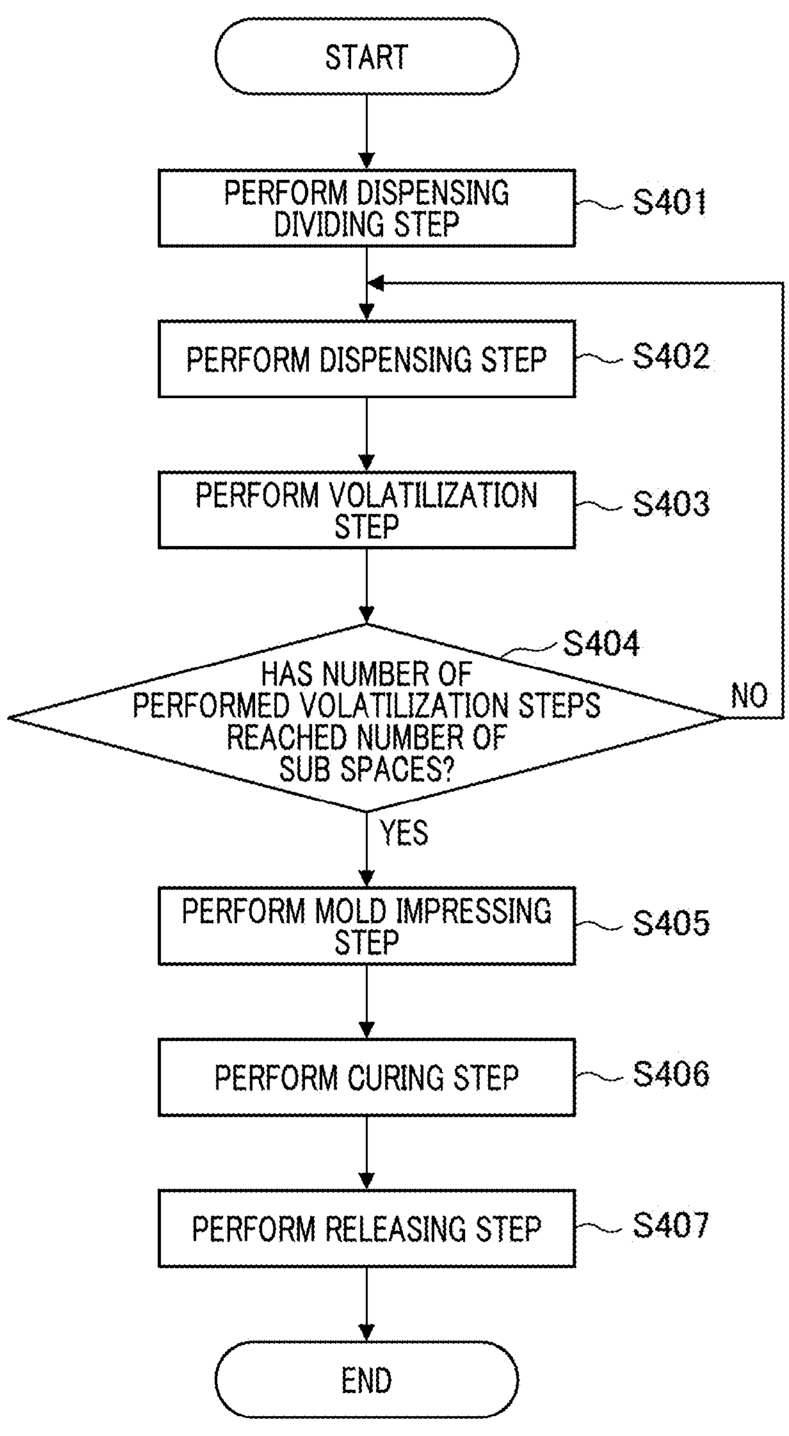
FIG. 4 is a flowchart illustrating a flow of a film forming process using the film formation apparatus according to the first embodiment.

FIG. 4 is a flowchart illustrating a process flow of the film forming process using the film formation apparatus 101 according to the first embodiment. Since the step of dividing the dispensing step has been mainly described above with reference to FIGS. 3A to 3E, a flow of steps in the film forming process (the film forming step) according to the present embodiment will be described below with reference to FIG. 4.

The process steps illustrated in FIG. 4 are realized by causing the controller 117 of the film formation apparatus 101 to execute a program stored in the memory. Description of step will be skipped by prefixing S to each step.

First, in S401, the controller 117 generates a plurality of sub spaces (sub areas) by dividing a space between the substrate 102 and the mold 103 (the division step). Specifically, first, the number of sub spaces is determined. Then, a droplet list corresponding to each determined sub space is prepared, and the prepared droplet list is stored in a storage medium such as a memory. Here, the droplet lists are prepared to correspond to the number of sub spaces. That is, in this process, as the droplet lists, the droplet list used to firstly perform the dispensing step is prepared with reference to unevenness information of the substrate 102, and the droplet list used to finally perform the dispensing step is prepared with reference to unevenness information including the patterned part 105 of the mold 103.

In S401, the processes of determination of the number of sub spaces, preparation of the droplet lists, and storage of the prepared droplet lists are performed by the controller 117. However, for example, determination of the number of sub spaces may be performed by a user, and information of the determined number of sub spaces may be stored in the storage medium such as a memory. In this case, the controller 117 reads the information of the number of sub spaces stored in the storage medium and generates the sub spaces on the basis of the information of the number of sub spaces. Thereafter, the controller 117 prepares a droplet list corresponding to each sub space and stores the prepared droplet lists in the storage medium such as a memory. In S401, for example, it is assumed that the space between the substrate and the mold is divided into two sub spaces as illustrated in FIG. 3, that is, the number of sub spaces is two.

Then, in S402, the controller 117 dispenses the liquid mixture 203 according to the sub spaces generated in S401

(the dispensing step). Specifically, the controller 117 controls driving of the dispenser 115 with reference to the droplet lists corresponding to the sub spaces prepared in S401 such that the first operation of dispensing the liquid mixture 203 on the pattern formation area of the substrate 102 or on the curable composition liquid film 206 is performed. When the liquid mixture 203 is dispensed onto the pattern formation area, the first dispensing step (the first-time first operation) is performed out of the plurality of divided dispensing steps. Then, when the liquid mixture 203 is dispensed onto the curable composition liquid film 206, the second or subsequent dispensing step (the second-time or subsequent first operation) is performed.

That is, when the number of sub spaces is two as described above, the controller 117 dispenses the liquid mixture 203 onto the pattern formation area of the substrate 102 with reference to the droplet list prepared on the basis of unevenness information of the substrate 102 in the first dispensing step (the first dispensing step). On the other hand, in the second dispensing step (the first dispensing step), the controller 117 dispenses the liquid mixture 203 onto the curable composition liquid film 206 with reference to the droplet list prepared on the basis of the unevenness information including the patterned part 105 of the mold 103.

Then, in S403, the controller 117 volatilizes the solvent 202 included in the liquid mixture film 205 formed in the dispensing step of S402 (the volatilization step). Specifically, the controller 117 performs the second operation of causing the film formation apparatus 101 to wait for a predetermined time until the solvent 202 included in the liquid mixture film 205 is volatilized (in the air).

The time in which the solvent 202 included in the liquid mixture film 205 is volatilized changes depending on the thickness of the liquid mixture film or the content of the solvent 202. Accordingly, for example, the controller 117 may calculate a waiting time in advance on the basis of information on the liquid mixture 203 which will be used in the film forming process and store the calculated waiting time in the storage medium such as a memory. Alternatively, the waiting time may be set in advance by a user before the film forming process is performed and be stored in the storage medium such as a memory. In this case, the controller 117 may read the waiting time calculated by itself or the waiting time set in advance by a user from the storage medium and control the film formation apparatus 101 such that the second operation is performed in the read waiting time. When the solvent 202 is volatilized as described above, for example, volatilization may be promoted by blowing air, volatilization may be promoted by applying heat, or volatilization of the solvent 202 may be promoted in combination thereof.

As described above, the volatilization step is performed according to the number of sub spaces. That is, when two sub spaces are generated, the first volatilization step (the first volatilization step) is performed when the first dispensing step (the first dispensing step) is completed, and the next volatilization step (the second volatilization step) is performed when the next dispensing step (the second dispensing step) is completed. In this way, in the present embodiment, even when a plurality of dispensing steps are performed, it is assumed that the volatilization step is performed after the dispensing step has been completed according to the number of performed dispensing steps.

Then, in S404, the controller 117 determines whether the number of volatilization steps performed in S403 has reached the number of sub spaces determined in S401 (the determination step). When it is determined that the number of volatilization steps performed in S403 has reached the number of sub spaces, the process flow proceeds to S405. On the other hand, when the number of volatilization steps performed in S403 has not reached the number of sub spaces, the process flow returns to S402, and the dispensing step and the volatilization step are performed.

In the present embodiment, since the dispensing step and the volatilization step are repeatedly performed according to the number of sub spaces as described above, the number of performed dispensing steps and the number of performed volatilization steps are the same. Here, it is determined whether the number of volatilization steps performed in S403 has reached the number of sub spaces, but the controller 117 may determine whether the number of performed dispensing steps has reached the number of sub spaces. That is, the controller 117 may perform the determination of S404 by determining whether the number of performed first operations or second operations has reached the determined number of sub spaces.

Then, in S405, the controller 117 controls the substrate drive mechanism 107 or the mold drive mechanism 110 such that a third operation of pressing the patterned part 105 of the mold 103 on the curable composition liquid film 206 formed on the substrate 102 is performed (the impressing step).

Then, in S406, the controller 117 controls the curing unit 111 in a state in which the patterned part 105 of the mold 103 is pressed on the curable composition liquid film 206 such that a fourth operation of emitting curing light from the curing unit 111 and irradiating the curable composition liquid film 206 with the light to cure the curable composition liquid film 206 is performed (the curing step). Accordingly, the curable composition liquid film 206 is cured to form the formation film 208.

Then, in S407, the controller 117 controls the mold drive mechanism 110 such that a fifth operation of driving the mold 103 in a direction in which it is separated from the substrate 102 (in the +Z direction) and releasing the mold 103 from the formation film 208 is performed (the releasing step). By completing up to the releasing step as described above, the formation film 208 is left on the substrate 102, and the film formation is completed. As described above, in the present embodiment, the third operation, the fourth operation, and the fifth operation are performed only when the number of volatilization steps performed in S403 has reached the number of sub spaces determined in S401.

In the present embodiment, the volatilization step is necessarily performed after each dispensing step as described above. Accordingly, it is possible to decrease the liquid film control distance L and to shorten the volatilization time T.

As described above, in the present embodiment, by divisionally dispensing the liquid mixture 203 a plurality of times, it is possible to easily control spread of the end of the liquid mixture film 205 which is likely to spread with an increase in an arrangement density of the droplets 201. Accordingly, it is possible to provide the film formation apparatus 101 that can easily control spread of a liquid film end to be formed.

Second Embodiment

In the first embodiment, it is assumed that the film formation apparatus 101 is an imprinting apparatus. In a second embodiment, it is assumed that the film formation apparatus 101 is a planarization apparatus. Since the configuration of the film formation apparatus 101, the components of the solvent 202, and the like are the same as in the first embodiment, the same description as in the first embodiment will be omitted in the second embodiment, and differences from the first embodiment will be described below.

The planarization apparatus is a device that is used to manufacture a flat substrate required for a photolithography process of manufacturing a semiconductor device. An example of an application destination of a substrate which is manufactured by the planarization apparatus is extreme ultraviolet exposure technology (EUV) which is recently attracting photolithography technology. Since a focal depth at which a projected image is formed decrease with a decrease in size, unevenness on a surface of a substrate to which a curable composition is supplied needs to be curbed in several tens of nm. In imprint technology, the same flatness as in EUV is required for improvement in fillability of a curable composition or improvement in linewidth precision, which is an application destination.

As process steps of forming a film of a curable composition on a substrate 102 using the planarization apparatus, a dispensing step, a volatilization step, an impressing step, a curing step, and a releasing step are performed to form a flat surface on the substrate 102. These steps are the same steps as in the imprinting process using the imprinting apparatus and are the same as the process steps according to the first embodiment described above with reference to FIG. 4 or the like, and thus description thereof will be omitted in the second embodiment.

Figure 5:
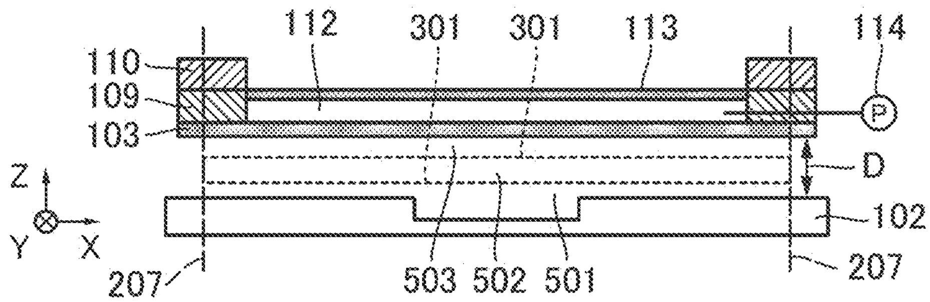
FIG. 5 is a diagram illustrating a dispensing dividing step of a film forming process using a planarization apparatus according to the first embodiment.

FIG. 5 is a diagram illustrating an example of a dispensing dividing step according to the second embodiment. The dispensing dividing step in the second embodiment is performed before the dispensing step is started similarly to the first embodiment.

A pattern of a mold 103 is transferred to a curable composition 104 on a substrate 102 in the imprinting apparatus, but unevenness of the substrate 102 is embedded with the curable composition 104 and a flat surface of a mold 103 is transferred in the planarization apparatus. The mold 103 in the imprinting apparatus includes a patterned part 105, but a mold 103 including the same or larger flat surface as the substrate 102 is used to flatten the whole surface of the substrate 102 at once in the planarization apparatus. An example thereof is a quartz glass substrate, and it is assumed that a quartz glass substrate is used as the mold 103 in the second embodiment.

In the first embodiment, the dispensing dividing step is described to use a method of equally dividing the target film thickness D. The same is true of the second embodiment, and thus detailed description will be omitted.

A method of limiting an amount of dispensing for each time will be described in the second embodiment. That is, the number of sub spaces to be generated is determined on the basis of the amount of dispensing for each time. With this method, since a maximum value of the amount of dispensing for each time can be limited, it is possible to avoid dispensing of liquid droplets 201 with a high density. When droplets 201 is dispensed with a high density, the dispenser 115 has to operate in a short period, dispensing performance may deteriorate due to an influence of residual vibration (cross-talk) or the like, and thus there is concern that precision of film formation may deteriorate.

In the present embodiment, a space between the substrate 102 and the mold 103 corresponding to the target film thickness D is divided. In the present embodiment, the divided spaces are defined as a first sub space 501, a second sub space 502, and a third sub space 503 in the order of formation of films.

In the present embodiment, since the amounts of dispensed liquid mixture 203 are the same for the sub spaces, the second sub space 502 and the third sub space 503 of which each is constituted by a space division plane 301 which is a flat surface or the mold 103 and the target position 207 have the same thickness (the dimension in the Z direction).

The first sub space 501 is constituted by the space division plane 301 which is a flat surface, the substrate 102 having unevenness, and the target position 207, and thus the curable composition 104 filling the unevenness of the substrate 102 is necessary. Accordingly, the thickness (the dimension in the Z direction) of the first sub space 501 is smaller than that of the second sub space 502 and the third sub space 503. Accordingly, the thickness (in the Z direction) of the liquid mixture film with which the end of the liquid mixture film in the second sub space 502 and the third sub space 503 constituted by only flat surfaces can be easily controlled is calculated in advance, and the amount of dispensing to be divided is determined on the basis of information of the calculated thickness of the liquid mixture film. The processes of the dispensing step, the volatilization step, the impressing step, the curing step, and the releasing step which are subsequent steps are the same as the processes in the first embodiment, and thus description thereof will be omitted.

In the first embodiment, it is assumed that the substrate 102 includes a flat surface. In the second embodiment, it is assumed that the mold 103 includes a flat surface. However, in actual tests, both may include a flat surface or both may include an uneven surface. In this case, the processes described in the first embodiment and the second embodiment can be preferably performed according to the surface type in consideration of the aforementioned details, configuration, and the like.

As described above, according to the second embodiment, it is possible to easily control spread of an end of the liquid mixture film 205 similarly to the first embodiment. As a result, according to the second embodiment, it is possible to provide the film formation apparatus 101 that can easily control spread of a liquid film end to be formed.

Embodiment of Article Manufacturing Method

An article manufacturing method according to the present embodiment can be suitably used to manufacture an article such as a micro device such as a semiconductor device or an element having a microstructure. The article manufacturing method according to the present embodiment includes a step of forming a pattern on a composition dispensed onto a substrate (a step of processing a substrate) using the film formation apparatus 101 and a step of processing the substrate on which the pattern has been performed through such a step. This article manufacturing method includes other known steps (oxidation, film formation, vapor deposition, doping, flattening, etching, composition removal, dicing, bonding, packaging, and the like). The article manufacturing method according to the present embodiment is more advantageous in at least one of performance, quality, productivity, and production cost of an article in comparison with a method according to the related art.

The pattern of a cured structure formed by the film formation apparatus 101 is used permanently for at least a part of various articles or temporarily at the time of manufacturing various articles. An article is an electrical circuit element, an optical element, an MEMS, a recording element, a sensor, or a mold. Examples of the electrical circuit element include volatile or nonvolatile semiconductor memories such as a DRAM, an SRAM, a flash memory, and an MRAM and semiconductor elements such as an LSI, a CCD, an image sensor, and an FPGA. Examples of the mold include a mold for substrate processing such as imprinting.

The pattern of a cured structure is used as a constituent member of at least a part of the article without any change or is temporarily used as a composition mask. After etching, ion implantation, or the like has been performed in a substrate processing process, the composition mask is removed.

Figure 6A:
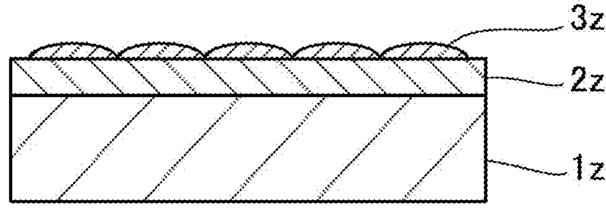
FIGS. 6A to 6F are diagrams schematically illustrating an article manufacturing method.

A specific article manufacturing method will be described below with reference to FIGS. 6A to 6F. As illustrated in FIG. 6A, a substrate 1*z* such as a silicon substrate in which a processing material 2*z* such as an insulator is formed on the surface is prepared, and then a composition 3*z* is applied to the surface of the processing material 2*z* using an ink jet method or the like. Here, a state in which a composition 3*z* which is a plurality of droplets is applied to the substrate 1*z* is illustrated.

Figure 6B:
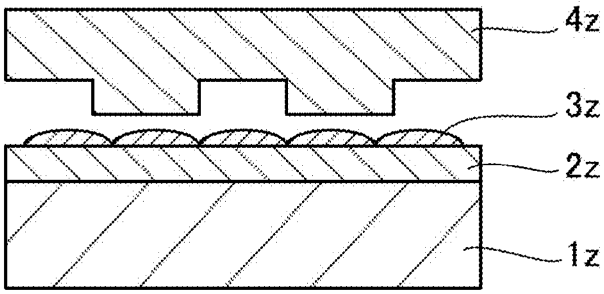
Figure 6C:
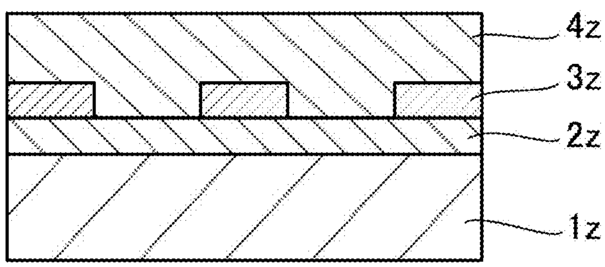

As illustrated in FIG. 6B, a mold 4*z* is disposed such that a surface on which an uneven pattern is formed faces the composition 3*z* on the substrate 1*z*. As illustrated in FIG. 6C, the substrate 1*z* to which the composition 3*z* is applied is brought into contact with the mold 4*z*, and a pressure is applied thereto (a contact step). A gap between the mold 4*z* and the processing material 2*z* is filled with the composition 3*z*. When light which is curing energy is applied via the mold 4*z* in this state, the composition 3*z* is cured (a curing step). At this time, in the present embodiment, the composition can be irradiated with light at an amount of irradiation by which an optimal degree of photo-polymerization is achieved on the basis of spectral sensitivity characteristics acquired in the apparatus.

Figure 6D:
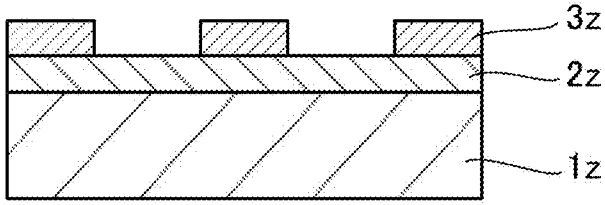

As illustrated in FIG. 6D, when the mold 4*z* and the substrate 1*z* are separated after the composition 3*z* has been cured, a pattern of a cured structure of the composition 3*z* is formed on the substrate 1*z* (a pattern forming step and a shaping step). This pattern of a cured structure has a shape in which a recessed part of the mold 4*z* corresponds to a protruding part of the cured structure and a protruding part of the mold 4*z* corresponds to a recessed part of the cured structure, that is, an uneven pattern of the mold 4*z* is transferred to the composition 3*z*.

Figure 6E:
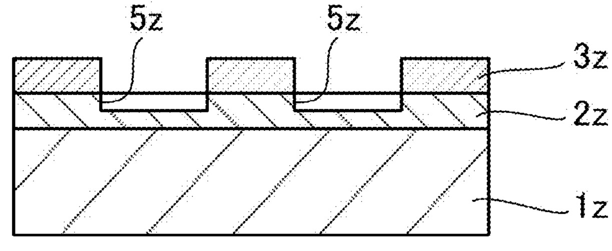
Figure 6F:
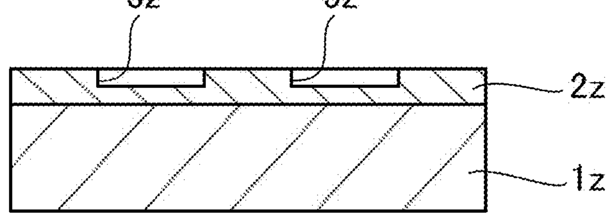

As illustrated in FIG. 6E, when etching is performed using the pattern of a cured structure as an etching-resistant mask, a part having no cured structure or having a cured structure remaining thin on the surface of the processing material 2*z* is removed to be a groove 5*z*. As illustrated in FIG. 6F, when the pattern of a cured structure is removed, an article in which the groove 5*z* is formed on the surface of the processing material 2*z* can be obtained. The pattern of a cured structure is removed herein, but the pattern of a cured structure may not be removed after the processing and may be used as, for example, an interlayer insulating film included in a semiconductor element, that is, a constituent member of an article. In the example, a mold for transferring a circuit pattern provided with an uneven pattern is used as the mold 4*z*, but a plane template having a flat surface without an uneven pattern may be used.

While exemplary embodiments of the present disclosure have been described above, the present disclosure is not limited to the embodiments and can be modified or altered in various forms within the scope of the gist thereof. The aforementioned embodiments may be combined.

Some or all of control processes in the aforementioned embodiments may be realized by transmitting a computer program for realizing the functions of the aforementioned embodiments to the film formation apparatus 101 or the like via a network or various storage media. A computer (or a CPU or an MPU) in each apparatus may read and execute the program. In this case, the program or the storage medium storing the program constitutes the present disclosure.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-186112, Oct. 31, 2023, which is hereby incorporated by reference wherein in its entirety.

What is claimed is:

1. A film formation apparatus configured to form a film of a curable composition in a space between a substrate and a mold by pressing the mold on the curable composition dispensed onto the substrate, the film formation apparatus comprising:
- a dispenser configured to dispense a liquid mixture in which the curable composition and a predetermined solvent are mixed onto the substrate or the top surface of the curable composition; and
- a controller configured to generate a plurality of sub spaces by dividing the space between the substrate and the mold,
- wherein the controller performs control such that a first operation of applying the liquid mixture and a second operation of volatilizing the solvent included in the liquid mixture are performed in the order of the first operation and the second operation according to the number of sub spaces, and
- wherein the controller divides the space between the substrate and the mold with a plane parallel to opposite surfaces of the substrate and the mold.

2. The film formation apparatus according to claim 1, wherein the controller performs control such that the first operation and the second operation are performed in the order of the first operation and the second operation according the number of sub spaces, and
- wherein the liquid mixture is dispensed to the top surface of the curable composition obtained by volatilizing the solvent from the liquid mixture when the first operation is performed after the second operation.

3. The film formation apparatus according to claim 1, wherein the plurality of sub spaces are sub spaces obtained by equally dividing a distance between the substrate and the mold according to the number of sub spaces.

4. The film formation apparatus according to claim 1, wherein the second operation is an operation of waiting for a predetermined time.

5. The film formation apparatus according to claim 1, wherein the controller determines whether the number of performed second operations has reached the number of sub spaces and performs control such that a third operation of bringing the mold into contact with the curable composition and a fourth operation of curing the curable composition through irradiation with light in a state in which the mold is in contact with the curable composition are performed when it is determined that the number of performed second operations has reached the number of sub spaces.

6. The film formation apparatus according to claim 1, wherein the controller adjusts a disposal position and an amount of the liquid mixture which is dispensed according to positions of the sub spaces.

7. The film formation apparatus according to claim 1, wherein the controller adjusts a dispensing position and an amount of the liquid mixture on the basis of a pattern installed in the mold for a sub space closest to the mold out of the plurality of sub spaces.

8. The film formation apparatus according to claim 1, wherein the controller adjusts a dispensing position and an amount of the liquid mixture on the basis of a pattern of the substrate for a sub space closest to the substrate out of the plurality of sub spaces.

9. The film formation apparatus according to claim 1, wherein components of the curable composition in the liquid mixture which is dispensed in the first operations corresponding to the sub spaces are the same.

10. The film formation apparatus according to claim 1, wherein components of the solvent in the liquid mixture which is dispensed in the first operations corresponding to the sub spaces are the same.

11. The film formation apparatus according to claim 1, wherein mixing proportions of the curable composition and the solvent in the liquid mixture which is dispensed in the first operations corresponding to the sub spaces are the same.

12. The film formation apparatus according to claim 1, wherein the controller determines the number of sub spaces on the basis of an amount of liquid mixture which is dispensed at one time.

13. The film formation apparatus according to claim 1, wherein the liquid mixture is a curable composition which is diluted with the solvent.

14. A film formation method of forming a film of a curable composition in a space between a substrate and a mold by pressing the mold on the curable composition dispensed onto the substrate, the film formation method comprising:

a dispensing step dispensing a liquid mixture in which the curable composition and a predetermined solvent are mixed onto the substrate or the top surface of the curable composition;

a division step of generating a plurality of sub spaces by dividing the space between the substrate and the mold; and a control step of performing control such that a first operation of applying the liquid mixture and a second operation of volatilizing the solvent included in the liquid mixture are performed in the order of the first operation and the second operation according to the number of sub spaces generated in the division step, wherein the division step divides the space between the substrate and the mold with a plane parallel to opposite surfaces of the substrate and the mold.

15. A film formation method of forming a film of a curable composition in a space between a substrate and a mold by pressing the mold on the curable composition dispensed onto the substrate, the film formation method comprising:

a dispensing step dispensing a liquid mixture in which the curable composition and a predetermined solvent are mixed onto the substrate or the top surface of the curable composition;

a volatilization step of volatilizing the solvent included in the liquid mixture; and a division step of generating a plurality of sub spaces by dividing the space between the substrate and the mold, wherein the dispensing step and the volatilization step are performed according to the number of times corresponding to the number of sub spaces generated in the division step, and the volatilization step is performed after the dispensing step has been completed, and wherein the division step divides the space between the substrate and the mold with a plane parallel to opposite surfaces of the substrate and the mold.

16. The film formation method according to claim 15, wherein, when the dispensing step is performed after the volatilization step, the liquid mixture is dispensed to the top surface of the curable composition obtained by volatilizing the solvent from the liquid mixture.

17. An imprinting apparatus configured to form a pattern of a curable composition in a plurality of pattern formation areas on a substrate by pressing a mold including a patterned part on the curable composition dispensed to the substrate, the imprinting apparatus comprising:

a dispenser configured to apply a liquid mixture in which the curable composition and a predetermined solvent are mixed onto the substrate or the top surface of the curable composition; and a controller configured to generate a plurality of sub spaces by dividing the space between the substrate and the mold, wherein the controller performs control such that a first operation of applying the liquid mixture and a second operation of volatilizing the solvent included in the liquid mixture are performed in the order of the first operation and the second operation according to the number of sub spaces, and wherein the controller divides the space between the substrate and the mold with a plane parallel to opposite surfaces of the substrate and the mold.

18. A planarization apparatus configured to form a flattening film of a curable composition on a substrate by pressing a mold including a planar part on the curable composition dispensed to the substrate, the planarization apparatus comprising:

a dispenser configured to apply a liquid mixture in which the curable composition and a predetermined solvent are mixed onto the substrate or the top surface of the curable composition; and a controller configured to generate a plurality of sub spaces by dividing the space between the substrate and the mold, wherein the controller performs control such that a first operation of applying the liquid mixture and a second operation of volatilizing the solvent included in the liquid mixture are performed in the order of the first operation and the second operation according to the number of sub spaces, and wherein the controller divides the space between the substrate and the mold with a plane parallel to opposite surfaces of the substrate and the mold.

19. An article manufacturing method using a film formation apparatus configured to form a film of a curable composition in a space between a substrate and a mold by pressing the mold on the curable composition dispensed onto the substrate, the film formation apparatus including:

a dispenser configured to apply a liquid mixture in which the curable composition and a predetermined solvent are mixed onto the substrate or the top surface of the curable composition; and a controller configured to generate a plurality of sub spaces by dividing the space between the substrate and the mold, wherein the controller performs control such that a first operation of applying the liquid mixture and a second operation of volatilizing the solvent included in the liquid mixture are performed in the order of the first operation and the second operation according to the number of sub spaces, and wherein the controller divides the space between the substrate and the mold with a plane parallel to opposite surfaces of the substrate and the mold, wherein the article manufacturing method comprises:

a film forming step of forming the film of the curable composition in the space between the substrate and the mold using the film formation apparatus;

a processing step of processing the substrate on which the film has been formed in the film forming step; and a step of manufacturing an article from the substrate processed in the processing step.

* * * * *